(12) United States Patent
Iwabuchi et al.

(10) Patent No.: US 11,894,221 B2
(45) Date of Patent: *Feb. 6, 2024

(54) SPUTTERING TARGET AND MAGNETIC FILM

(71) Applicant: JX Metals Corporation, Tokyo (JP)

(72) Inventors: Yasuyuki Iwabuchi, Ibaraki (JP); Manami Masuda, Ibaraki (JP); Takashi Kosho, Ibaraki (JP)

(73) Assignee: JX Metals Corporation, Tokyo (JP)

(*) Notice: Subject to any disclaimer, the term of this patent is extended or adjusted under 35 U.S.C. 154(b) by 651 days.

This patent is subject to a terminal disclaimer.

(21) Appl. No.: 16/960,384

(22) PCT Filed: May 23, 2019

(86) PCT No.: PCT/JP2019/020558
§ 371 (c)(1),
(2) Date: Jul. 7, 2020

(87) PCT Pub. No.: WO2020/031461
PCT Pub. Date: Feb. 13, 2020

(65) Prior Publication Data
US 2020/0357438 A1 Nov. 12, 2020

(30) Foreign Application Priority Data

Aug. 9, 2018 (JP) .................. 2018-150676

(51) Int. Cl.
*H01J 37/34* (2006.01)
*C23C 14/34* (2006.01)
*C22C 19/07* (2006.01)
*H01F 41/18* (2006.01)
*H01F 10/16* (2006.01)
*G11B 5/65* (2006.01)
*G11B 5/851* (2006.01)

(52) U.S. Cl.
CPC .......... *H01J 37/3429* (2013.01); *C22C 19/07* (2013.01); *C23C 14/3414* (2013.01); *G11B 5/656* (2013.01); *G11B 5/658* (2021.05); *G11B 5/851* (2013.01); *H01F 10/16* (2013.01); *H01F 41/183* (2013.01)

(58) Field of Classification Search
CPC .............. H01J 37/3426; H01J 37/3429; C23C 14/3414; H01F 41/183; H01F 10/16; C22C 19/07; C22C 45/04; C22C 5/04; C22C 27/06; C22C 30/00; C22C 1/0433; C22C 1/05; G11B 5/851; G11B 5/656; G11B 5/658; B22F 3/1017; B22F 3/12; B22F 2201/20; B22F 2999/00
See application file for complete search history.

(56) References Cited

U.S. PATENT DOCUMENTS

| | | | |
|---|---|---|---|
| 11,591,688 B2* | 2/2023 | Shimizu | G11B 5/7334 |
| 11,618,944 B2* | 4/2023 | Masuda | G11B 5/658 |
| | | | 204/192.2 |
| 2008/0084632 A1 | 4/2008 | Shimizu | |
| 2013/0134038 A1 | 5/2013 | Sato et al. | |
| 2013/0206593 A1 | 8/2013 | Arakawa et al. | |
| 2013/0213802 A1 | 8/2013 | Sato et al. | |
| 2016/0276143 A1 | 9/2016 | Goto et al. | |
| 2021/0246543 A1* | 8/2021 | Shimizu | G11B 5/658 |
| 2021/0310114 A1* | 10/2021 | Masuda | C23C 14/08 |

FOREIGN PATENT DOCUMENTS

| | | |
|---|---|---|
| CN | 103261469 A | 8/2013 |
| JP | S60228637 A | 11/1985 |
| JP | 2001/256631 A | 9/2001 |
| JP | 2006-155861 A | 6/2006 |
| JP | 2009/090601 A | 4/2009 |
| JP | 2011/174174 A | 9/2011 |
| JP | 2011/175725 A | 9/2011 |
| JP | 2011-208169 A | 10/2011 |
| JP | 4885333 B1 | 2/2012 |
| JP | 2012/117147 A | 6/2012 |
| JP | 2016-115379 A | 6/2016 |
| WO | WO-2012/086388 A1 | 6/2012 |
| WO | WO-2014/141737 A1 | 9/2014 |
| WO | WO-2015/064761 A1 | 5/2015 |

OTHER PUBLICATIONS

Machine Translation JP 60228637 (Year: 1985).*
Derwent Abstract JP 60228637 (Year: 1985).*
Search Report in International Application No. PCT/JP2019/020558 dated Aug. 6, 2019, 3 pages.
Office Action in CN Application No. 2019800007232.0 dated Dec. 2, 2021, 14 pages.
International Preliminary Report on Patentability in International Application No. PCT/JP2019/020558 dated Feb. 11, 2021, 5 pages.

* cited by examiner

Primary Examiner — Michael A Band
(74) Attorney, Agent, or Firm — MARSHALL, GERSTEIN & BORUN LLP

(57) ABSTRACT

Provided is a sputtering target, comprising: from 0.001 mol % to 0.5 mol % of Bi; from 45 mol % or less of Cr; 45 mol % or less of Pt; 60 mol % or less of Ru; and a total of 1 mol % to 35 mol % of at least one metal oxide, the balance being Co and inevitable impurities.

4 Claims, No Drawings

SPUTTERING TARGET AND MAGNETIC FILM

FIELD OF THE INVENTION

This disclosure describes a technique relating to a sputtering target and a magnetic film.

BACKGROUND OF THE INVENTION

For example, when producing a magnetic recording medium, a recording layer and other certain multiple layers forming the magnetic recording medium are sequentially formed by sputtering on a substrate using multiple sputtering targets corresponding to the respective layers. In this case, a sputtering target may be used which has certain oxide particles dispersed in metal phases containing Co as a main component and further containing Cr and Pt (see, for example, Patent Documents 1 to 10).

By the way, there is a problem that during film formation by sputtering, abnormal discharge, so-called arcing, may be generated, causing particles as deposits on the substrate, which reduces a yield of film formation.

More particularly, in the sputtering target for magnetic materials as described above, it is believed that an oxide added to a Co—Cr—Pt based alloy falls off from the sputtering target during arcing, which causes the generation of particles.

To solve such problems, Patent Document 11 discloses: "the present inventors have found that when mixing and pulverizing raw material powder with a ball mill or the like, primary sintered body powder obtained by previously mixing, sintering and pulverizing the raw material powder is mixed, thereby providing further refinement of a target structure". It also discloses a method for producing a sputtering target for forming a magnetic recording film based on the findings. Specifically, it discloses "a method for producing a sputtering target for forming a magnetic recording film, the sputtering target containing a non-magnetic oxide, Cr and Pt, the balance being Co and unavoidable impurities, the method comprising: a primary sintering step of sintering primary mixed powder to obtain a primary sintered body, the primary mixed powder being obtained by mixing raw material powder of each element of Co, Cr and Pt as a single substance or as an alloy of two or more of the elements with non-magnetic oxide raw material powder; a pulverizing step of pulverizing the primary sintered body to obtain primary sintered body powder; and a secondary sintering step of mixing secondary mixed powder with the primary sintered body powder, pulverizing them, and then sintering them, the secondary mixed powder having the mixed raw material powder, wherein the secondary mixed powder has an average particle diameter of from 0.05 to 30 μm, and wherein the primary sintered body powder has a maximum particle diameter of less than 200 μm. It also discloses that according to this, it is possible to obtain a high-quality film uniformly, and to reduce the generation of particles, in particular to produce a perpendicular magnetic recording type medium having high density.

Further, Patent Document 12 discloses "a sintered body sputtering target having a structure in which metal phases and oxide phases are uniformly dispersed, wherein each of the metal phases contains Co, Pt and Mn as components, and each of the oxide phases contains an oxide made of at least Mn". It also discloses that according to the sputtering target of Patent Document 12, it produces outstanding effects that can reduce an amount of particles generated during sputtering and improve a yield of film formation.

CITATION LIST

Patent Literatures

[Patent Document 1] Japanese Patent Application Publication No. 2011-208169 A
[Patent Document 2] Japanese Patent Application Publication No. 2011-174174 A
[Patent Document 3] Japanese Patent Application Publication No. 2011-175725 A
[Patent Document 4] Japanese Patent Application Publication No. 2012-117147 A
[Patent Document 5] Japanese Patent No. 4885333 B
[Patent Document 6] U.S. Patent Application Publication No. 2013/0134038 A1
[Patent Document 7] WO 2012/086388 A1
[Patent Document 8] U.S. Patent Application Publication No. 2013/0213802 A1
[Patent Document 9] WO 2015/064761 A1
[Patent Document 10] U.S. Patent Application Publication No. 2016/0276143 A1
[Patent Document 11] Japanese Patent Application Publication No. 2011-208169 A
[Patent Document 12] WO 2014/141737 A1

SUMMARY OF THE INVENTION

As described in Patent Document 11, the refinement of the structure of the sputtering target is effective for reducing the generation of particles. However, even if the structure of the oxide phase in the sputtering target is sufficiently fine, the discharge may become unstable during sputtering. Such a problem cannot be addressed by the technique proposed in Patent Document 11. If the discharge is unstable, there is a risk that, for example, arcing easily occurs and particles increase. Further, further refinement of the structure beyond a certain level is not easy in view of feasibility and productivity.

Although Patent Document 12 discloses that Mn is contained in the metal phases and the oxide phases of the sputtering target, it may not be preferable to contain Mn in a relatively large amount depending on the applications.

The present disclosure proposes a sputtering target and a magnetic film, which can improve stability of discharge during sputtering in order to solve the above problems.

A sputtering target disclosed in the disclosure comprises from 0.001 mol % to 0.5 mol % of Bi; 45 mol % or less of Cr; 45 mol % or less of Pt; 60 mol % or less of Ru; and a total of 1 mol % to 35 mol % of at least one metal oxide, the balance being Co and inevitable impurities.

Further, a magnetic film disclosed in the disclosure comprises from 0.001 mol % to 0.5 mol % of Bi; 45 mol % or less of Cr; 45 mol % or less of Pt; 60 mol % or less of Ru; and a total of 1 mol % to 35 mol % of at least one metal oxide, the balance being Co and inevitable impurities.

According to the sputtering target as described above, it contains from 0.001 mol % to 0.5 mol % of Bi, whereby stability of discharge during sputtering can be improved.

DETAILED DESCRIPTION OF THE INVENTION

A sputtering target according to an embodiment contains from 0.001 mol % to 0.5 mol % of Bi; 45 mol % or less of Cr; 45 mol % or less of Pt; 60 mol % or less of Ru; and a total of 1 mol % to 35 mol % of at least one metal oxide, the balance being Co and inevitable impurities.

In particular, the containing of Bi in the predetermined amount results in the presence of metal phases having a lower work function in the sputtering target, so that an emission rate of secondary electrons due to collision of cations is increased. Therefore, it is possible to stabilize a discharge state even under conditions where the electron density is lower, that is, a lower gas pressure, a low sputtering power, and the like. As a result, the generation of arcing, and hence the generation of particles, can be effectively reduced.

(Composition of Sputtering Target)

The metal component of the sputtering target is mainly composed of Co, and may additionally contain at least one selected from the group consisting of Pt, Cr and Ru. In particular, the metal component may be a Co alloy containing at least one selected from the group consisting of Pt, Cr and Ru. Examples include a Co—Pt alloy, a Co—Cr—Pt alloy, a Co—Cr—Pt—Ru alloy, and the like. Alternatively, there may be an alloy mainly based on Ru or the like, other than Co. One or more of Pt, Cr and Ru may not be contained, especially Cr and Ru.

When the sputtering target contains Pt, a content of Pt is 45 mol % or less. Depending on the embodiments, there is a sputtering target in which the content of Pt is 0 mol %, that is, Pt is not contained. When the sputtering target contains Cr, a content of Cr is 45 mol % or less. When the sputtering target contains Ru, a content of Ru is 60 mol % or less. The contents of Pt, Cr, and Ru may vary according to layers used in the media or other uses, designs of the media, and the like. In this embodiment, the contents are not more than the upper limits as described above.

The sputtering target according to this embodiment is characterized by containing Bi as a metal component in an amount of from 0.001 mol % to 0.5 mol %, in addition to the metal elements as described above.

Since Bi has a lower work function than that of each of Co, Cr, Pt, and Ru, the containing of Bi in the sputtering target results in the presence of metal phases having a lower work function, so that electrons will be easily released from the target during sputtering and the discharge state during sputtering will be stabilized. As a result, arcing due to the composition of the metal side can be effectively prevented. Therefore, the generation of particles will be effectively suppressed.

Since the refinement of the structure of the oxide phase as in the proposed technique as described above resulted in unstable discharge during sputtering and tended to generate arcing depending on the composition of the metal phase, the particles that could be generated accordingly could not be addressed. On the other hand, since the sputtering target according to this embodiment contains Bi, the arcing due to the composition of the metal phase, and hence the generation of particles, can be effectively suppressed.

Further, Bi is relatively easy to handle, among metals having a lower work function than that of each of Co, Cr, Pt, and Ru. In other words, the metals having a lower work function other than Bi may be highly toxic and violently reactive with water, which may be dangerous for handling.

The content of Bi is from 0.001 mol % to 0.5 mol %. That is, if the content of Bi is less than 0.001 mol %, it means that the content is excessively low, so that the effect of stabilizing the discharge state due to the presence of the metal phases having a lower work function cannot be sufficiently obtained.

By the way, it is widely known that in Co—Pt alloys, the addition of a nonmagnetic metal such as Cr and Ru can allow for adjustment of magnetic properties such as reduction of saturation magnetization and reduction of magnetic anisotropy. If the content of Bi is more than 0.5 mol %, the magnetic properties are changed so as to decrease the saturation magnetization and magnetic anisotropy of the film. From this point of view, the content of Bi may preferably be from 0.005 mol % to 0.5 mol %, and more preferably from 0.01 mol % to 0.5 mol %.

Optionally, the sputtering target according to the embodiment may further contain, as a metal component, at least one selected from the group consisting of Au, Ag, B, Cu, Ge, Ir, Mn, Mo, Nb, Ni, Pd, Re, Rh, Ta, W, and V. The total content of at least one selected from the group consisting of Au, Ag, B, Cu, Ge, Ir, Mn, Mo, Nb, Ni, Pd, Re, Rh, Ta, W and V may preferably be from 1 mol % to 30 mol %.

The sputtering target has a granular structure in which metal oxides are dispersed in the metals, so that the sputtering target will contain the metal oxides. The total content of metal oxides is from 1 mol % to 35 mol %. The total content of metal oxides is preferably from 10% by volume to 55% by volume in a volume fraction. If the total content of the metal oxides is less than 10% by volume, an amount of the metal phases is increased, and any unstable discharge is thus difficult to occur even if Bi is not added, so that the effect of adding Bi may be reduced. On the other hand, if the total content of the metal oxide is more than 55% by volume, the amount of the oxides is too high and the metals are not connected to each other. Therefore, even if Bi is added and the metal phases having a lower work function are present, discharge may be unstable. From this viewpoint, the total content of the metal oxides is more preferably from 15% by volume to 55% by volume, and further preferably from 20% by volume to 50% by volume.

The volume fraction of the oxides can be determined by calculation from density and molecular weight of each component contained in the sputtering target, but can also be determined from an area ratio of the oxide phases on any cut plane of the sputtering target. In this case, the volume ratio of the oxide phases in the sputtering target can be the area ratio on the cut surface.

Specific examples of the metal oxides include oxides of Co, Cr, Si, Ti, and B. Therefore, the sputtering target according to the present embodiment may contain an metal oxide of at least one element selected from the group consisting of Co, Cr, Si, Ti, and B.

(Method for Producing Sputtering Target)

The above sputtering target can be produced such as by a powder sintering method, and specific examples of the production method are described below.

First, as metal powder, Co powder and Bi powder, as well as at least one metal powder selected from the group consisting of Pt powder, Cr powder and Ru powder are prepared. Optionally, powder of at least one metal selected from the group consisting of Au, Ag, B, Cu, Ge, Ir, Mn, Mo, Nb, Ni, Pd, Re, Rh, Ta, W and V may be prepared.

The metal powder may be powder of not only a single element but also an alloy. The particle diameter of the metal power is preferably in a range of from 1 μm to 150 μm, in terms of enabling homogeneous mixing to prevent segregation and coarse crystallization. If the particle diameter of the metal powder is more than 150 μm, oxide particles as described below may not be uniformly dispersed, and if it is less than 1 μm, the sputtering target may deviate from the desired composition due to the impact of oxidation of the metal powder.

Further, as the oxide powder, for example, $TiO_2$ powder, $SiO_2$ powder and/or $B_2O_3$ powder are prepared. The oxide powder preferably has a particle diameter in a range of from 1 µm to 30 µm. This can lead to more uniform dispersion of the oxide particles in the metal phases when the oxide powder is mixed with the metal powder and sintered under pressure. If the particle diameter of the oxide powder is more than 30 µm, coarse oxide particles may be formed after firing under pressure. On the other hand, if it is less than 1 µm, agglomeration of the oxide powder may occur.

The above metal powder and oxide powder are then weighed so as to provide a desired composition, and mixed and pulverized using a known method such as a ball mill. In this case, it is desirable to fill the inside of a container used for the mixing/pulverizing with an inert gas to suppress the oxidation of the raw material powder as much as possible. This can provide mixed powder in which the defined metal powder and oxide powder are uniformly mixed.

The mixed powder thus obtained is then sintered under pressure in a vacuum atmosphere or an inert gas atmosphere, and formed into a predetermined shape such as a disk shape. Herein, various pressure sintering methods can be employed such as a hot press sintering method, a hot hydrostatic sintering method, a plasma discharge sintering method and the like. Among them, the hot hydrostatic sintering method is effective in terms of improvement of density of a sintered body.

A retention temperature during the sintering is in a temperature range of from 600 to 1500° C., and more preferably from 700° C. to 1400° C. A time for maintaining the temperature in this range is preferably 1 hour or more. A pressing pressure during the sintering is preferably 10 MPa or more, and more preferably 20 MPa or more.

This can provide a sintered body having a sufficiently high density to perform sputtering stably.

The sintered body obtained by the above sintering under pressure can be subjected to cutting or other machining for forming a desired shape using a lathe or the like, to produce a sputtering target in the form of a disc or the like.

(Magnetic Film)

A magnetic film can be formed by performing sputtering with a sputtering device, generally a magnetron sputtering device, using the sputtering target as described above.

Such a magnetic film has substantially the same composition as that of the sputtering target as described above.

More particularly, the magnetic film contains from 0.001 mol % to 0.5 mol %, preferably from 0.005 mol % to 0.5 mol %, more preferably from 0.01 mol % to 0.5 mol %, of Bi, and also contain 45 mol % or less of Cr, 45 mol % or less of Pt, 60 mol % or less of Ru, a total of 1 mol % to 35 mol % of at least one metal oxide, the balance being Co and inevitable impurities. The magnetic film may contain from 45 mol % or less of Pt, but in some embodiments, there is a magnetic film having a content of Pt of 0 mol %, that is, containing no Pt.

The metal oxide in the magnetic film may include an oxide of at least one element selected from the group consisting of Co, Cr, Si, Ti and B. The total content of metal oxides may be 10% by volume to 55% by volume.

The magnetic film may further contain from 1 mol % to 30 mol % of at least one selected from the group consisting of Au, Ag, B, Cu, Ge, Ir, Mn, Mo, Nb, Ni, Pd, Re, Rh, Ta, W and V.

Such a magnetic film can be used for various applications. For example, the magnetic film can be suitably used as a recording layer on a substrate forming a perpendicular magnetic recording type magnetic recording medium, among an underlying layer, intermediate layer and protective layer, such as adhesive layers, soft magnetic layers, seed layers, and Ru layers.

In contrast to the conventional horizontal magnetic recording method in which magnetism is recorded in the horizontal direction with respect to the recording surface, the perpendicular magnetic recording type magnetic recording medium records magnetism in a direction perpendicular to the recording surface. Therefore, the perpendicular magnetic recording type magnetic recording medium can provide higher density recording, so that it is widely employed for hard disk drives and the like. Specifically, the perpendicular magnetic recording type magnetic recording medium is formed by sequentially laminating an underlying layer, an intermediate layer, a recording layer and a protective layer such as an adhesion layer, a soft magnetic layer, a seed layer and a Ru layer on a substrate such as aluminum and glass, for example.

The sputtering target as described above is particularly suitable for forming the recording layer among the above layers.

EXAMPLES

Next, the sputtering targets were experimentally produced and their performance was confirmed as described below. However, the description herein is merely for the purpose of illustration and is not intended to be limited thereto.

Metal powder and metal oxide powder were weighed so as to have each composition ratio as shown in Table 1.

Subsequently, each powder was weighed, and then sealed in a 10 liter ball mill pot together with zirconia balls as grinding media and mixed by rotating it for 24 hours. The mixed powder removed from the ball mill was filled into a carbon cylindrical mold having a diameter of 190 mm and sintered by hot pressing. The hot pressing conditions were a vacuum atmosphere, a heating rate of 300° C./hour, a retention temperature of 1000° C., and a retention time of 2 hours. A pressure of 30 MPa was applied from the start of heating to the end of retention. After the end of retention, it was naturally cooled as it is in the chamber. Each sintered body thus obtained was cut to obtain each sputtering target.

Sputtering was carried out using each sputtering target as described above. Here, as a sputtering device, C-3010 from CANON ANELVA CORPORATION was used. A position of a magnet disposed on a back surface of each target was adjusted such that the maximum value of a magnetic flux on the target surface was 300 gauss. A pressure was set to about 0.3 Pa by allowing an argon gas to flow at 4 sccm, and discharge was carried out 10 times at a set power of 200 W. A case where a difference between the maximum voltage immediately after the start of discharge, which was recorded at the start of discharge, and the average voltage for 1 second from the start of discharge was 300 V or more was considered to be unstable discharge voltage, and the stability of the discharge was evaluated by its probability.

TABLE 1

| | Composition [mol %] | Oxide Volume Fraction | Unstable Discharge Probability |
|---|---|---|---|
| Example 1 | 67.999Co—20Pt—0.001Bi—2TiO2—4SiO2—6CoO | 26% | 40% |
| Example 2 | 67.995Co—20Pt—0.005Bi—2TiO2—4SiO2—6CoO | 26% | 30% |
| Example 3 | 67.99Co—20Pt—0.01Bi—2TiO2—4SiO2—6CoO | 26% | 10% |
| Example 4 | 67.9Co—20Pt—0.1Bi—2TiO2—4SiO2—6CoO | 26% | 0% |
| Example 5 | 67.5Co—20Pt—0.5Bi—2TiO2—4SiO2—6CoO | 25% | 10% |
| Example 6 | 74.6Co—0.4Bi—15TiO2—10CoO | 43% | 20% |
| Example 7 | 40.8Co—45Cr—0.2Bi—2B2O3—4TiO2—8Cr2O3 | 39% | 20% |
| Example 8 | 68.98Co—4Cr—15Pt—0.02Bi—3B2O3—3TiO2—3SiO2—3Co3O4 | 37% | 20% |
| Example 9 | 22.997Co—50Ru—0.003Bi—21TiO2—6CoO | 45% | 40% |
| Example 10 | 78.94Co—6Cr—6Ru—0.06Bi—3B2O3—2SiO2—3Cr2O3—1Co3O4 | 31% | 20% |
| Example 11 | 61.99Co—18Pt—3Ru—0.01Bi—6B2O3—8SiO2—3Cr2O3 | 47% | 0% |
| Example 12 | 37.993Co—10Cr—35Pt—10Ru—0.007Bi—2TiO2—1SiO2—4CoO | 12% | 30% |
| Example 13 | 74.6Co—0.1Bi—15TiO2—10CoO | 43% | 10% |
| Example 14 | 74.6Co—0.5Bi—15TiO2—10CoO | 43% | 20% |
| Example 15 | 40.8Co—45Cr—0.1Bi—2B2O3—4TiO2—8Cr2O3 | 39% | 10% |
| Example 16 | 40.8Co—45Cr—0.5Bi—2B2O3—4TiO2—8Cr2O3 | 39% | 20% |
| Example 17 | 22.997Co—50Ru—0.1Bi—21TiO2—6CoO | 45% | 20% |
| Example 18 | 22.997Co—50Ru—0.5Bi—21TiO2—6CoO | 45% | 30% |
| Example 19 | 78.94Co—6Cr—6Ru—0.1Bi—3B2O3—2SiO2—3Cr2O3—1Co3O4 | 31% | 0% |
| Example 20 | 78.94Co—6Cr—6Ru—0.5Bi—3B2O3—2SiO2—3Cr2O3—1Co3O4 | 31% | 10% |
| Comp. 1 | 68Co—20Pt—2TiO2—4SiO2—6CoO | 26% | 80% |
| Comp. 2 | 67.9999Co—20Pt—0.0001Bi—2TiO2—4SiO2—6CoO | 26% | 70% |
| Comp. 3 | 75Co—15TiO2—10CoO | 44% | 100% |
| Comp. 4 | 41Co—45Cr—2B2O3—4TiO2—8Cr2O3 | 39% | 70% |
| Comp. 5 | 69Co—4Cr—15Pt—3B2O3—3TiO2—3SiO2—3Co3O4 | 37% | 90% |
| Comp. 6 | 23Co—50Ru—21TiO2—6CoO | 45% | 80% |
| Comp. 7 | 79Co—6Cr—6Ru—3B2O3—2SiO2—3Cr2O3—1Co3O4 | 31% | 80% |
| Comp. 8 | 62Co—18Pt—3Ru—6B2O3—8SiO2—3Cr2O3 | 47% | 90% |
| Comp. 9 | 38Co—10Cr—35Pt—10Ru—2TiO2—1SiO2—4CoO | 13% | 70% |

In Examples 1 to 20, each sputtering target contained Bi in the predetermined amount. Therefore, it was found that the probability of unstable discharge was effectively reduced as compared with Comparative Examples 1 to 9 as described later.

In Comparative Examples 1 and 3 to 9, each sputtering target did not contain Bi. Therefore, the probability of unstable discharge was higher. In Comparative Example 2, the sputtering target contained Bi, but the content of Bi was too low, so that the probability of unstable discharge was not sufficiently reduced.

In view of the foregoing, it was found that the sputtering targets of Examples 1 to 20 can improve the stability of discharge during sputtering.

The invention claimed is:

1. A sputtering target comprising a sintered body, the sputtering target having metal phases and oxide phases, and comprising:
   from 0.1 mol % to 0.5 mol % of Bi;
   at least one of 4 mol % to 45 mol % of Cr and 15 mol % to 35 mol % of Pt;
   50 mol % or less of Ru; and
   at least one oxide of at least one element selected from the group consisting of Co, Cr, Si, Ti, and B, wherein said at least one oxide has a volume fraction of 12% to 39%, the balance containing Co and inevitable impurities.

2. The sputtering target according to claim 1, wherein the sputtering target further comprises from 1 mol % to 30 mol % of at least one selected from the group consisting of Au, Ag, B, Cu, Ge, Ir, Mn, Mo, Nb, Ni, Pd, Re, Rh, Ta, W, and V.

3. A magnetic film for a perpendicular magnetic recording type magnetic recording medium, the magnetic film having metal phases and oxide phases, the magnetic film comprising:
   from 0.1 mol % to 0.5 mol % of Bi;
   at least one of 4 mol % to 45 mol % of Cr and 15 mol % to 35 mol % of Pt;
   50 mol % or less of Ru; and
   at least one oxide of at least one element selected from the group consisting of Co, Cr, Si, Ti, and B, wherein said at least one oxide has a volume fraction of 12% to 39%, the balance containing Co and inevitable impurities,
   wherein the magnetic film is formed by performing sputtering using the sputtering target according to claim 1.

4. The magnetic film according to claim 3, wherein the magnetic film further comprises from 1 mol % to 30 mol % of at least one selected from the group consisting of Au, Ag, B, Cu, Ge, Ir, Mn, Mo, Nb, Ni, Pd, Re, Rh, Ta, W, and V.

* * * * *